United States Patent
Tsai et al.

(10) Patent No.: US 8,227,175 B2
(45) Date of Patent: Jul. 24, 2012

(54) METHOD FOR SMOOTHING PRINTED CIRCUIT BOARDS

(75) Inventors: Chung-Jen Tsai, Tayuan (TW); Yu-Cheng Huang, Tayuan (TW); Hung-Yi Chang, Tayuan (TW); Cheng-Hsien Lin, Tayuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 334 days.

(21) Appl. No.: 12/467,291

(22) Filed: May 17, 2009

(65) Prior Publication Data
US 2010/0035187 A1 Feb. 11, 2010

(30) Foreign Application Priority Data
Aug. 5, 2008 (CN) .......................... 2008 1 0303385

(51) Int. Cl.
*H05K 3/00* (2006.01)
(52) U.S. Cl. ............ 430/314; 430/311; 29/829; 29/825; 174/250

(58) Field of Classification Search .................. None
See application file for complete search history.

(56) References Cited

U.S. PATENT DOCUMENTS
4,884,337 A * 12/1989 Choinski ..................... 29/846
* cited by examiner

*Primary Examiner* — Daborah Chacko Davis
(74) *Attorney, Agent, or Firm* — Altis Law Group, Inc.

(57) ABSTRACT

A method for smoothing a printed circuit board (PCB), comprising: providing a PCB having a first smooth outer surface and an opposite second outer surface, the second outer surface including a smooth region and a plurality of dimples; applying a liquid photoresist layer onto the second outer surface of the PCB to fill the dimples; solidifying the liquid photoresist in the dimples to obtain a solidified photoresist layer; polishing the solidified photoresist layer until a surface thereof being coplanar with the smooth region; and polishing the entire second outer surface until the solidified photoresist layer is removed, thereby obtaining a plain outer surface parallel to the first smooth outer surface.

7 Claims, 6 Drawing Sheets

```
┌─────────────────────────────────────────────────────────┐
│ providing a PCB having a first smooth outer surface and an │
│ opposite second outer surface and including a smooth     │──1
│ region and a plurality of dimples on the second outer    │
│ surface;                                                 │
└─────────────────────────────────────────────────────────┘
                            │
┌─────────────────────────────────────────────────────────┐
│ applying a liquid photoresist layer onto the second outer│──2
│ surface of the PCB filling the dimples;                  │
└─────────────────────────────────────────────────────────┘
                            │
┌─────────────────────────────────────────────────────────┐
│ solidifying the liquid photoresist in the dimples;       │──3
└─────────────────────────────────────────────────────────┘
                            │
┌─────────────────────────────────────────────────────────┐
│ polishing the solidified photoresist layer until a surface│──4
│ thereof being coplanar with the smooth region;           │
└─────────────────────────────────────────────────────────┘
                            │
┌─────────────────────────────────────────────────────────┐
│ polishing the entire second outer surface until the      │
│ solidified photoresist layer is removed and thereby      │──5
│ obtaining a plain outer surface parallel to the first smooth│
│ outer surface.                                           │
└─────────────────────────────────────────────────────────┘
```

FIG. 1

METHOD FOR SMOOTHING PRINTED CIRCUIT BOARDS

BACKGROUND

1. Technical Field

The present disclosure relates to a method for manufacturing a printed circuit board (PCB), and more particularly, a method for smoothing a PCB.

2. Description of Related Art

In a traditional buried hole metallization process of manufacturing a multilayer PCB, the buried hole is filled with an electrically conductive material to electrically connect two adjacent conductive layers (e.g. copper layer) on two opposite sides of a substrate. However, after filling the buried hole, the surface of the conductive layers may have dimples. The dimples may cause a series of problems in the continuing processes, such as electrically conductive traces formed from the electrically conductive layers using a typical exposing, developing and etching process have different line widths in different areas. Hence, it is necessary to provide a method for manufacturing PCBs can overcome above problems.

BRIEF DESCRIPTION OF THE DRAWINGS

Many aspects of the method for smoothing a printed circuit board can be better understood with reference to the following drawings. The components in the drawings are not necessarily drawn to scale, the emphasis instead being placed upon clearly illustrating the principles of embodiments. Moreover, in the drawings, like reference numerals designate corresponding parts throughout the different views.

FIG. 1 is a flow chart of a method for smoothing a PCB.

DETAILED DESCRIPTION

Referring to FIGS. 1-6, a method for smoothing a PCB provided in an exemplary embodiment includes the following steps.

Figure 2:
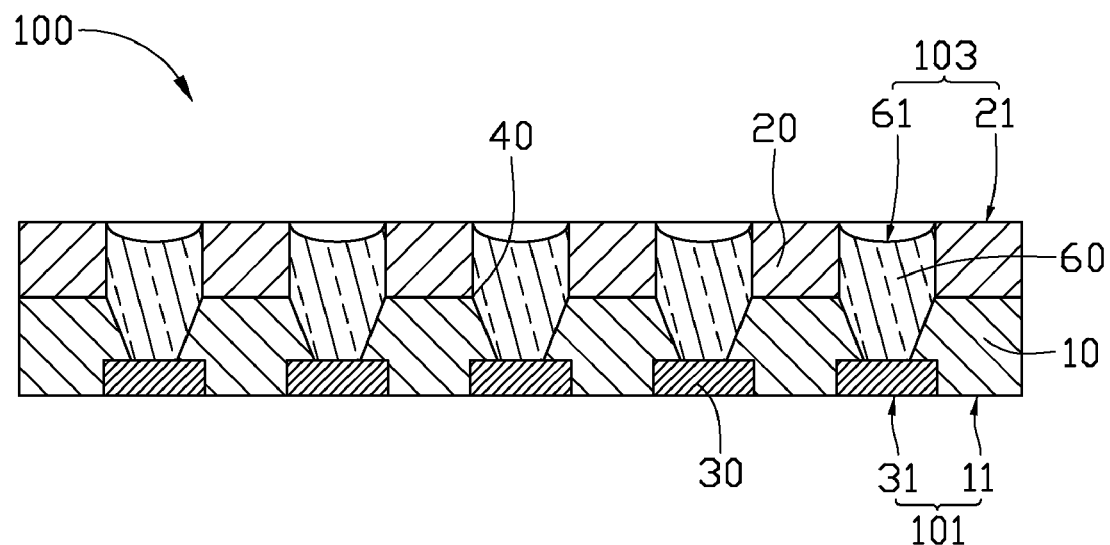
FIG. 2 is a cross-sectional view of a PCB to be smoothed according to an exemplary embodiment, the PCB including a first smooth outer surface and an opposite second outer surface and having five dimples and six smooth regions on the second outer surface thereof.

In step 1, referring to FIG. 2, a PCB 100 is provided. The PCB 100 includes a base 10, a first electrically conductive layer 20 and a second electrically conductive layer 30. The PCB 100 defines five buried holes 40 therein passing through the first electrically conductive layer 20 and a portion of the base 10 while exposing a portion of the second electrically conductive layer 30. An electrically conductive material 60 fills in each of the buried holes 40 and electrically connected to the first and second electrically conductive layers 20, 30. The electrically conductive material 60 has a rough end surface 61 and an arc cross-section at the rough end surface 61.

The PCB 100 has a first smooth outer surface 101 and an opposite second outer surface 103. The first smooth outer surface 101 consists of a smooth outer surface 31 of the second electrically conductive layer 30, and a smooth outer surface 11 of the base 10 coplanar with the smooth outer surface 31. The second outer surface 103 consists of a smooth outer surface 21 of the first electrically conductive layer 20, and the arc cross-sectional end surface 61 of the electrically conductive material 60. The rough end surface 61 is defined as a dimple of PCB 100, and the smooth outer surface 21 is defined as a smooth region of PCB 100.

Figure 3:
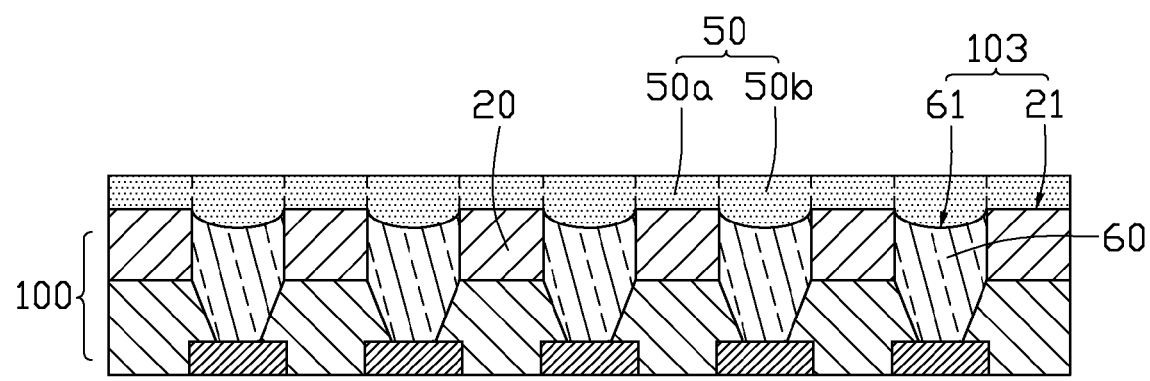
FIG. 3 is similar to FIG. 2, but showing a liquid photoresist layer applied to cover the entire second outer surface of the PCB.

In step 2, referring to FIG. 3, a liquid photoresist layer 50 is applied onto the PCB 100 using a typical sputtering, coating or printing process to cover the entire second outer surface 103. The liquid photoresist layer 50 is comprised of typical positive photoresist capable of depolymerizing under ultra violet radiation. If the positive photoresist is solid at normal temperature, then the positive photoresist can be firstly melted into liquid state. Thereafter, the dimples 61 are filled with the liquid photoresist material. In one example, the liquid photoresist material may flow into the dimples causing the smooth regions 21 to be covered. Accordingly, the liquid photoresist layer 50 defines a first portion 50a on the smooth region 21 and a second portion 50b in the dimples 61. Alternatively, the liquid photoresist layer 50 can be comprised of typical negative photoresist capable of polymerizing under ultra violet radiation.

Furthermore, for purpose of improving interface force between the liquid photoresist layer 50 and the PCB 100, prior to applying the liquid photoresist layer 50 onto the PCB 100, the smooth region 21 and the dimples 61 are treated with a lye and etched with an etchant. And additionally, the liquid photoresist can be only applied into the dimples 61 until the dimples 61 are filled.

Figure 4:
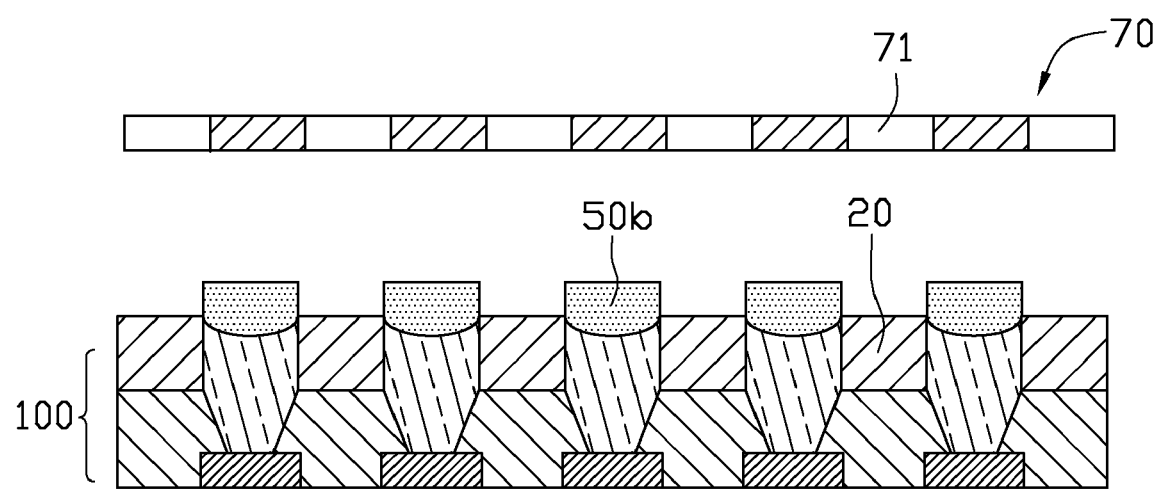
FIG. 4 is similar to FIG. 3, but showing that the liquid photoresist filled in the dimples is solidified and remained.

In step 3, referring to FIGS. 3-4, the first portion 50a of the photoresist layer 50 on the first electrically conductive layer 20 is removed. In detail, the liquid photoresist layer 50 is firstly semi-solidified using a baking process to evaporate most of liquid base material contained in the liquid photoresist layer 50. In such manner, an interface adhesion force between the liquid photoresist layer 50 and the PCB 100 is improved, and the liquid photoresist layer 50 is firmly adhered to the PCB 100. Secondly, the first portion 50a of the photoresist layer 50 is exposed under ultra violet radiation and developed with a developing agent. In the present embodiment, the photoresist layer 50 is exposed under a photo mask 70 defining a plurality of through holes 71 with the first portion 50a facing to the through holes 71. After exposing, the first portion 50a of the photoresist layer is depolymerized while the second portion 50b of the photoresist layer is solidified and remained. Thereafter, the first portion 50a of the photoresist layer is removed using a developing agent. Finally, the second portion 50b of the photoresist layer is fully solidified by baking. As such, the second portion 50b of the photoresist layer is steadily adhered to the first electrically conductive layer 20.

Alternatively, if the liquid photoresist layer 50 is comprised of negative photoresist material, the photo mask 60 is placed in a manner that the second portion 50b of the photoresist layer 50 faces the through holes 61. Hence, the second portion 50b corresponding to the through holes 61 is polymerized, and the first portion 50a of the photoresist layer 50 is not polymerized and easily removed.

Figure 5:
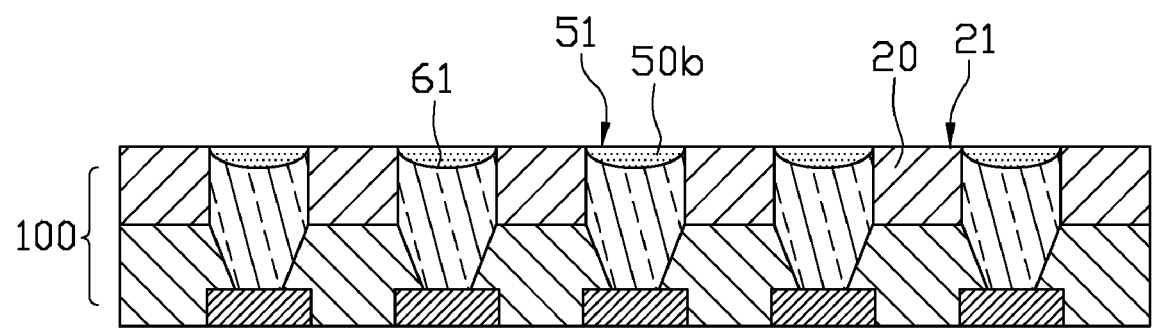
FIG. 5 is similar to FIG. 4, but showing polishing the photoresist filling in the dimples until an end surface thereof being coplanar with the smooth regions.

In step 4, referring to FIGS. 4-5, the second portion 50b of the photoresist layer is polished using a roll process until an end surface 51 thereof gets coplanar with the smooth region 21.

Figure 6:
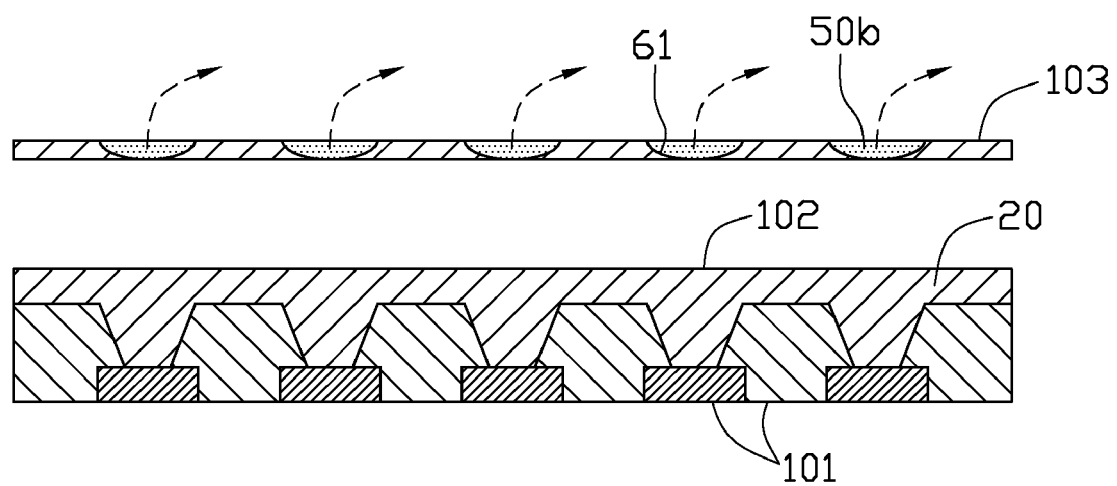
FIG. 6 is similar to FIG. 5, but showing polishing the entire second outer surface until the solidified photoresist layer is removed and a plain outer surface parallel to the first smooth outer surface is obtained.

In step 5, referring to FIG. 6, the entire second outer surface 103 is polished until the second portion 50b of the photoresist layer in the dimples region 61 is removed, thereby obtaining a plain outer surface 102 parallel to the first smooth outer surface 101.

In the present embodiment, prior to smooth the PCB 100, the dimples regions 61 are filled with the second portion 50b of the photoresist layer with an end surface 51 thereof being coplanar with the smooth regions 21. As such, when applying an external force to smooth the PCB 100 using a roll process, the external force uniformly distributes in the PCB 100, thereby obtaining a plain outer surface 102.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A method for smoothing a printed circuit board (PCB), comprising:
    providing a PCB comprising a base, a first electrically conductive layer and a second electrically conductive layer, the PCB defining a plurality of buried holes therein passing through the first electrically conductive layer and a portion of the base while exposing a portion of the second electrically conductive layer, an electrically conductive material filling in each of the buried holes and electrically connected to the first and the second electrically conductive layers, the PCB having a first smooth outer surface on the base and the second electrically conductive layer, and an opposite second outer surface, the second outer surface including a smooth region on the first electrically conductive layer and a plurality of dimples each having an arc cross-section on the electrically conductive material;
    applying a liquid photoresist layer onto the entire second outer surface of the PCB to fill the dimples;
    removing the portions of the liquid photoresist layer on the smooth region, with the portions of the liquid photoresist layer corresponding to the dimples remaining, thereby forming protrusions of the liquid photoresist layer;
    solidifying the remaining portions of the liquid photoresist layer to obtain a solidified photoresist layer;
    polishing the protrusions of the solidified photoresist layer until a surface of the protrusions is coplanar with the smooth region, with portions of the solidified photoresist layer in the dimples remaining; and
    polishing the entire second outer surface until the solidified photoresist layer is completely removed, thereby obtaining a plain outer surface parallel to the first smooth outer surface.

2. The method as claimed in claim 1, further comprising etching the second outer surface of the PCB prior to applying the liquid photoresist layer onto the second outer surface of the PCB.

3. The method as claimed in claim 1, wherein the portions of the liquid photoresist layer on the smooth region are removed using an exposing process, and a developing process.

4. The method as claimed in claim 1, wherein the liquid photoresist layer in the dimples is solidified using an exposing process, a baking process, or a combination thereof.

5. The method as claimed in claim 1, wherein the liquid photoresist layer is comprised of solid positive photoresist material, the method further comprising melting the positive photoresist material into a liquid state.

6. The method as claimed in claim 1, wherein the liquid photoresist layer is comprised of negative photoresist material, and the liquid photoresist layer is applied onto the PCB using a coating, a sputtering, or a printing process.

7. The method as claimed in claim 1, wherein the liquid photoresist layer is firstly semi-solidified using a baking process to evaporate most of liquid base material contained in the liquid photoresist layer prior to the removing of the portions of the liquid photoresist layer on the smooth region.

* * * * *